United States Patent
Lachartre

(10) Patent No.: US 9,509,320 B2
(45) Date of Patent: Nov. 29, 2016

(54) FEEDBACK LOOP FREQUENCY SYNTHESIZER DEVICE

(71) Applicant: Commissariat a l'energie atomique et aux energies alternatives, Paris (FR)

(72) Inventor: David Lachartre, Montbonnot (FR)

(73) Assignee: Commissariat à l'énergie atomique et aux énergies alternatives, Paris (FR)

(*) Notice: Subject to any disclaimer, the term of this patent is extended or adjusted under 35 U.S.C. 154(b) by 0 days.

(21) Appl. No.: 15/004,378

(22) Filed: Jan. 22, 2016

(65) Prior Publication Data

US 2016/0218722 A1  Jul. 28, 2016

(30) Foreign Application Priority Data

Jan. 23, 2015 (FR) ...................... 15 50560

(51) Int. Cl.
H03B 21/00 (2006.01)
H03L 7/083 (2006.01)
(Continued)

(52) U.S. Cl.
CPC ............. H03L 7/083 (2013.01); H03L 7/0802 (2013.01); H03L 7/085 (2013.01); H03M 1/66 (2013.01); H03M 3/422 (2013.01)

(58) Field of Classification Search
CPC ..... H04M 1/505; H03K 4/026; G06F 1/0328
USPC ................ 327/105–107, 156–159, 147–150; 375/226, 375; 331/1 A, 18
See application file for complete search history.

(56) References Cited

U.S. PATENT DOCUMENTS 5,329,253 A * 7/1994 Ichihara .................. H03L 7/185
327/105
5,821,816 A * 10/1998 Patterson ................ H03L 7/183
327/105
(Continued)

FOREIGN PATENT DOCUMENTS

FR  2 763 196 A1  11/1998
FR  2 908 946 A1  5/2008
(Continued)

OTHER PUBLICATIONS

French Preliminary Search Report issued Dec. 4, 2015 in Patent Application No. 1550560 (with English translation of categories of documents).
(Continued)

*Primary Examiner* — Lincoln Donovan
*Assistant Examiner* — Thomas Skibinski
(74) *Attorney, Agent, or Firm* — Oblon, McClelland, Maier & Neustadt, L.L.P.

(57) ABSTRACT

This frequency synthesis device comprises a servo circuit for the control of a frequency provided as output by a reference frequency received as input, with this circuit comprising a first phase accumulator clocked at a frequency linked to the reference frequency, a first digital-to-analog converter, a phase comparator, a loop filter and a controlled frequency oscillator providing an electrical signal oscillating at the output frequency. It further comprises a feedback loop connecting the output to the phase comparator, comprising a second phase accumulator clocked at a frequency linked to the output frequency and a second digital-to-analog converter. A reduction in dynamics by quantization is provided between each phase accumulator and each respective digital-to-analog converter, with this quantization being carried out by truncation of digital values of accumulated phases at the output of each phase accumulator.

10 Claims, 9 Drawing Sheets

(51) Int. Cl.
*H03L 7/08* (2006.01)
*H03L 7/085* (2006.01)
*H03M 1/66* (2006.01)
*H03M 3/00* (2006.01)

(56) References Cited

U.S. PATENT DOCUMENTS

| | | | |
|---|---|---|---|
| 6,844,836 B1 * | 1/2005 | Lee | H03L 7/1978 327/105 |
| 7,103,622 B1 * | 9/2006 | Tucholski | G06F 1/0328 327/105 |
| 2002/0125957 A1 | 9/2002 | Takahashi | |
| 2005/0220181 A1 | 10/2005 | Rasmussen | |
| 2008/0024240 A1 | 1/2008 | Wang | |
| 2008/0122504 A1 | 5/2008 | Van Der Valk et al. | |
| 2009/0096539 A1 * | 4/2009 | Chang | H03L 7/085 331/1 A |
| 2011/0133795 A1 | 6/2011 | Kim et al. | |
| 2015/0015308 A1 * | 1/2015 | Da Dalt | H03L 7/093 327/106 |

FOREIGN PATENT DOCUMENTS

| | | |
|---|---|---|
| WO | WO 04/001974 A1 | 12/2003 |
| WO | WO 2009/053531 A1 | 4/2009 |

OTHER PUBLICATIONS

Robert Bogdan Staszewski, et al., "Phase-Domain All-Digital Phase-Locked Loop" IEEE Transactions on Circuits and Systems-II: Express Briefs, vol. 52, No. 3, Mar. 2005, pp. 159-163.

* cited by examiner

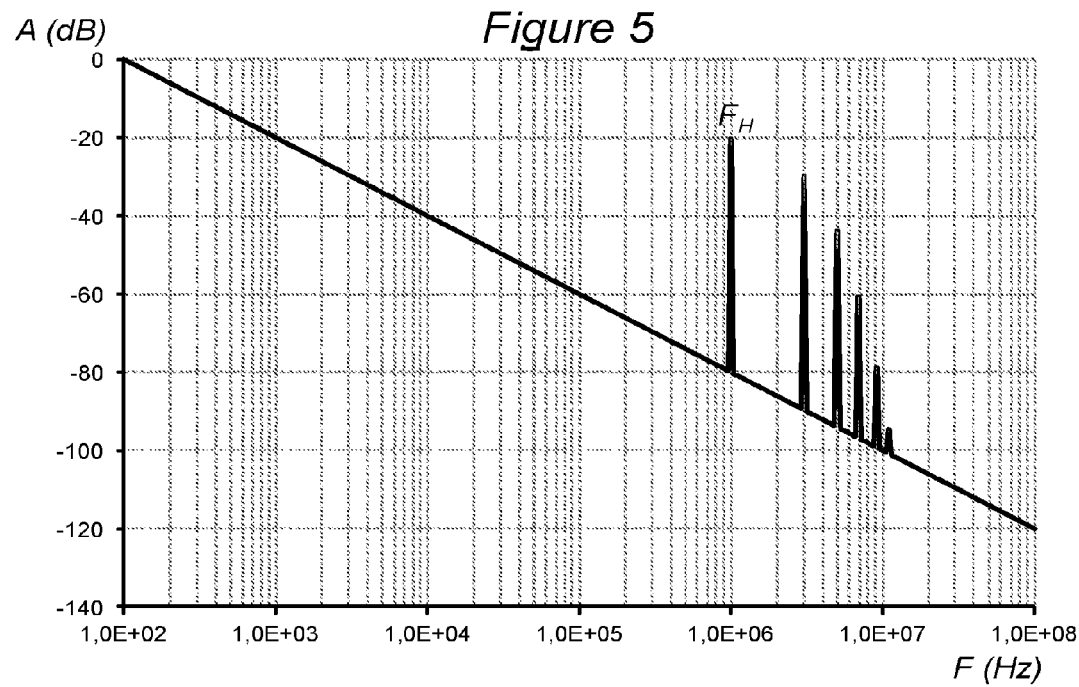
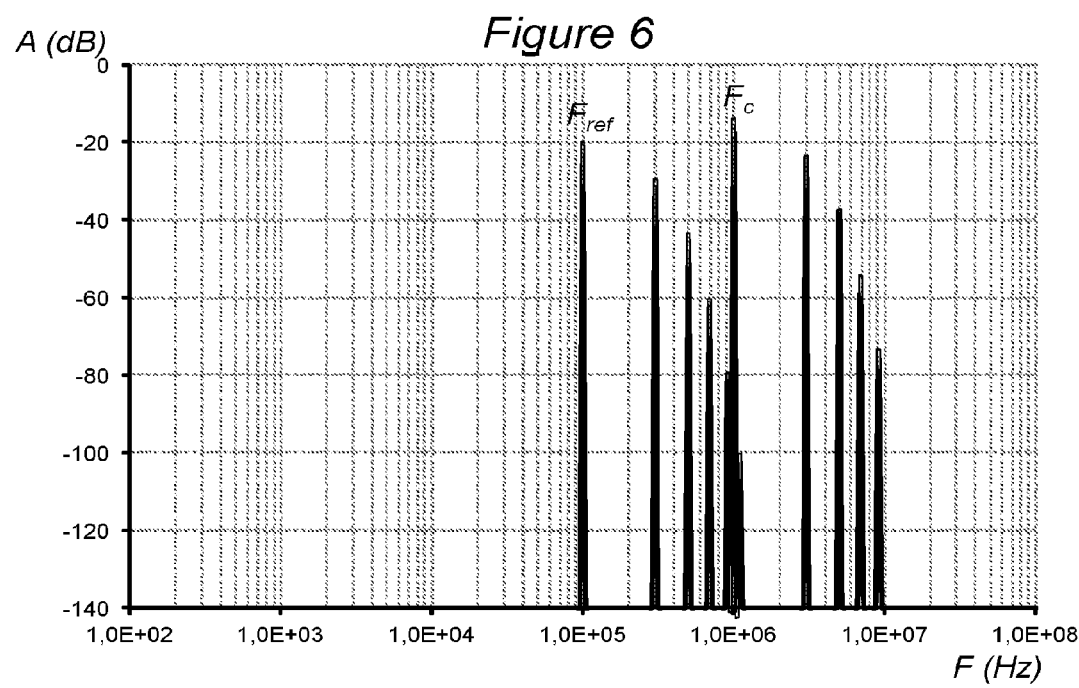

FEEDBACK LOOP FREQUENCY SYNTHESIZER DEVICE

BACKGROUND OF THE INVENTION

Such devices are known, for example servo phase loops generally referred to as phase locked loops (PLL).

A device of this type comprises:
- an input intended to receive an electrical signal oscillating at a reference frequency,
- an output intended to provide an electrical signal oscillating at an output frequency,
- a servo circuit for the control of the output frequency by the reference frequency, connecting the input to the output of the device and comprising a phase comparator, a loop filter and a controlled frequency oscillator providing the electrical signal oscillating at the output frequency, and
- a feedback loop connecting the output to one of the two comparison inputs of the phase comparator.

The controlled frequency oscillator, for example of the VCO (Voltage Controlled Oscillator), DCO (Digitally Controlled Oscillator) or other type, is controlled by a digital value, a voltage or an analog current, or even a combination of an analog value and digital value. Although this is generally not the case, the transfer function of such an oscillator is often considered as linear and simply represented by a conversion factor K.

The phase comparator operates in general on the edges of two signals to be compared, i.e. when these signals reach the same value at the same slope. The phase comparator then itself provides one or several signals that represent the phase difference between the edges of the two compared signals. Most of the time, the signals resulting from the comparison are transformed into a single current or voltage pulse signal by a charge pump. This current (or voltage) is of a constant amplitude I (or U), it takes the sign of the phase difference and its pulse has a width that is proportional to the phase difference. The phase comparator can be carried out in a more or less analog or digital manner.

The pulse provided by the charge pump is then filtered by the loop filter which has as a base the pulse response of an integrator filter. The loop filter can also be carried out in a more or less analog or digital manner.

The result coming from the loop filter is then applied as a control of the controlled frequency oscillator. As the loop filter is an integrator and the integral of the phase of a periodic signal gives its frequency, the control of the oscillator is indeed proportional to a frequency that will move towards the desired frequency as output as the phase difference with the reference signal will move towards 0 or towards another constant value.

The PLL are as such generally used in electronic circuits as sources of high frequencies. Indeed, these devices make it possible using a source with a low frequency and a high spectral purity (for example quartz emitting periodic signals at a few MHz) to obtain high-frequency periodic signals (for example a few GHz) and with a spectral purity of better quality than devices that directly generate high-frequency signals.

Concretely, for a source of reference frequency that is low and of high spectral purity $F_{ref}$, a high-frequency signal with good spectral purity $F_c = \alpha \cdot F_{ref}$ is obtained as output, a being a multiplication factor chosen greater than 1. This multiplication factor $\alpha$ is generally variable and of a non-integer real value so as to vary the various channels of standards used according to the application.

A major parameter of frequency synthesis devices is the time $\Delta t$ for establishing their operating regime, i.e. the time that they take to be operational, either at start-up, or during a change in the channel (i.e. a change in the factor $\alpha$). This time $\Delta t$ lasts during a transient regime, generally qualified as pull-in time, preceding the operating regime. As such for example, during the passing $\Delta F_c$ from a frequency $F_c$ to a frequency $F'_c$, the transient regime of synthesized frequency follows an exponential envelope that moves asymptotically towards $F'_c$ at a natural resonant frequency w during the duration $\Delta t$. The duration $\Delta t$ of the pull-in time depends on parameters that constitute a frequency synthesis device and limit its reactivity.

Another major parameter of frequency synthesis devices is the resolution of the possible variations of the multiplication factor $\alpha$ and therefore the fineness of the adjustment that is possible on the output frequency $F_c$ according to the target applications or standards.

Other parameters to be considered, in order to optimize frequency synthesis devices and the quality of the periodic signals of frequency $F_c$ obtained as output, include phase noise, jitter, spurious signals and electrical consumption.

DESCRIPTION OF PRIOR ART

According to a well-known design of PLL, referred to as integer division, the multiplication factor $\alpha$ is chosen as the quotient of two integer values N and D where the value N is generally greater than D. In order to achieve this servo $F_c = \alpha \cdot F_{ref} = N/D \cdot F_{ref}$, a frequency divider of factor D is arranged in the servo circuit between the input and a first comparison input of the phase comparator, while a frequency divider of factor N is arranged in the feedback loop between the output, which corresponds to the output of the controlled frequency oscillator, and a second comparison input of the phase comparator. In this way, the frequency of the two signals compared by the phase comparator is intended to converge towards $F_{ref}/D = F_c/N$ when the loop is locked. As such, as output of the phase comparator, although filtered by the loop filter, this frequency $F_{ref}/D$ is found at the level of the control of the controlled frequency oscillator and therefore as a spurious signal in the spectrum of the output signal. Furthermore, it is clear that the value of D is directly correlated with the resolution of the possible variations of the multiplication factor $\alpha$ since these variations are made, for various possible values of N, by frequency steps of $F_{ref}/D$.

This results in that to increase the resolution of the possible variations of the multiplication factor $\alpha$, it is suitable to increase the value of D. But in this case, the frequency $F_{ref}/D$ would be reduced and it would then be suitable to also reduce the bandwidth of the loop filter in order to reduce the resulting spurious signals in the spectrum of the output signal. However, limiting the bandwidth of the loop filter results in extending the time $\Delta t$ for establishing the operating regime. Consequently, jointly optimizing the two major parameters of a PLL, which form the time for establishing the operating regime and the resolution of the possible variations of the multiplication factor $\alpha$, is impossible to carry out with an integer division PLL.

Furthermore, the contributions to phase noise induced as output also depend directly on the cut-off frequency of the PLL. In the bandwidth, the noise is dominated by the contribution of the reference signal. Although multiplied by $\alpha$, it remains in general less than that provided by the PLL itself. It can as such be preferable to increase the cut-off frequency of the PLL in order to lower the phase noise in the lower portion of the spectrum obtained as output. But in this case, it is to the detriment of the value of D. Consequently, jointly optimizing the phase noise and the resolution of the possible variations of the multiplication factor α, is impossible to carry out with an integer division PLL.

A partial solution to these disadvantages consists in designing a PLL with fractional steps as disclosed in patent application FR 2 763 196 A1. In this case, the frequency divider arranged in the feedback loop switches between the factor N and the factor N+1 according to a predetermined desired proportion, in such a way as to produce on the average, thanks to the loop filter, a multiplication factor α=(N+β)/D, with 0≤β≤1. As such, without increasing the value of D, it becomes possible to increase the resolution of the possible variations of the multiplication factor α.

However, in order to carry out this switching of the divider of the feedback loop between the two values N and N+1 according to a desired proportion, a Delta-Sigma modulator is generally used. This modulator has the particularity of generating a signal resulting from a quantization of the coefficient β over 1 bit and the quantization necessarily produces a quantization error which, in the case of the Delta-Sigma modulator, is not evenly distributed in the output spectrum but is amplified in the high frequencies. The loop filter therefore partially attenuates the noise resulting from this error. However, a PLL with fractional step produces a signal that remains more or less tainted with additional noise due to the generation of the coefficient β. Furthermore the more precision β needs (i.e. for a better resolution at constant N and D), the more substantial this additional noise will be.

In addition, a PLL with a fractional step does also not optimize the phase noise independently of the multiplication factor α, with the operating frequency of the phase comparator remaining dependent on this factor.

Another solution consists in not using frequency dividers but phase accumulators, such as disclosed in patent applications US 2011/0133795 A1 and WO 2009/053531 A1, or in the article of Staszewski et al, entitled "Phase-domain all-digital phase-locked loop", published in March 2005 in IEEE Transactions on Circuits and Systems-II: express briefs, vol. 52, no. 3, pages 159-163, in such a way as to digitally calculate phase accumulations using each one of the reference and output signals rather than carrying out a comparison of phases on signals coming from dividers. This other solution is in particular well adapted to the design of PLL referred to as "fully digital".

In accordance with this other solution, the invention relates more particularly to a feedback-loop frequency synthesis device comprising:
an input intended to receive an electrical signal oscillating at a reference frequency,
an output intended to provide an electrical signal oscillating at an output frequency,
a servo circuit for the control of the output frequency by the reference frequency, connecting the input to the output of the device and comprising a first phase accumulator clocked at a frequency linked to the reference frequency, a phase comparator, a loop filter and a controlled frequency oscillator providing the electrical signal oscillating at the output frequency, and
a feedback loop connecting the output to one of the two comparison inputs of the phase comparator, comprising a second phase accumulator clocked at a frequency linked to the output frequency.

As such, for an integer division PLL with multiplication factor α=N/D, the first phase accumulator can for example be associated with a phase increment value equal to N and the second to a phase increment value equal to D.

It results from this other solution that the operating frequency of the phase comparator can be rendered independent of the factor α and therefore of the choice of D. D can then be increased in much higher proportions than those of frequency division devices, while still retaining a high operating frequency of the phase comparator, for a better resolution without a concession on the time Δt for establishing the operating regime or on the phase noise.

However this other solution provides digital values as outputs of the phase accumulators and the latter are clocked according to different frequencies. More precisely, in documents US 2011/0133795 A1, WO 2009/053531 A1 and in the aforementioned article of Staszewski et al, the frequency whereon are clocked the digital values coming from the first phase accumulator is $F_{ref}$, while the frequency whereon are clocked the digital values coming from the second phase accumulator is $F_c$. The data provided to the phase comparator, which is nothing other than a digital subtractor, is not synchronized amongst itself, which raises an issue. This issue is for example resolved partially and in a non-satisfactory manner in WO 2009/053531 A1, or in the aforementioned article of Staszewski et al, by singularly complicating the feedback loop in order to attempt to resynchronize between them the digital data coming from the two phase accumulators. This resynchronization furthermore generates additional noise.

It can thus be desired to provide a feedback-loop frequency synthesis device that makes it possible to overcome at least part of the aforementioned problems and constraints.

SUMMARY OF THE INVENTION

A feedback-loop frequency synthesis device is therefore proposed comprising:
an input intended to receive an electrical signal oscillating at a reference frequency,
an output intended to provide an electrical signal oscillating at an output frequency,
a servo circuit for the control of the output frequency by the reference frequency, connecting the input to the output of the device and comprising a first phase accumulator clocked at a frequency linked to the reference frequency, a phase comparator, a loop filter and a controlled frequency oscillator providing the electrical signal oscillating at the output frequency, and
a feedback loop connecting the output to one of the two comparison inputs of the phase comparator, comprising a second phase accumulator clocked at a frequency linked to the output frequency,
wherein:
a first digital-to-analog converter is arranged in the servo circuit between the first phase accumulator and the phase comparator,
a second digital-to-analog converter is arranged in the feedback loop between the second phase accumulator and the phase comparator, and
the phase comparator is an analog signal processing device.

As such, not only a frequency synthesis device according to the invention renders the operating frequency of the phase comparator independent of the factor α, but in addition it simply and effectively resolves the synchronization difficulties that can be generated by the use of phase accumulators. By transforming the digital signals coming from these accumulators into analog signals in continuous time, and by using a phase comparator that can process these analog signals, a phase difference value is produced analogically and in continuous time that can be directly provided to the loop filter.

Optionally, the phase comparator is an adder or a subtractor in continuous time of the analog signals that it receives as input.

Also optionally, the first and second phase accumulators have a common accumulated phase threshold value beyond which it is provided to subtract a modulo value from the phase value accumulated in each one of the first and second phase accumulators.

Also optionally, a synchronization mechanism is provided to subtract the modulo value at the same instant in each one of the first and second phase accumulators as soon as the common threshold value is exceeded in each one of the first and second phase accumulators.

Also optionally, the threshold value and the modulo value are equal.

Also optionally, a frequency divider is arranged in the feedback loop between the output and the second phase accumulator.

Also optionally, the frequency divider has a division factor chosen in such a way that, for a desired servo factor of control of the output frequency by the reference frequency, the second phase accumulator has a phase increment value that can be as close as possible to a phase increment value of the first phase accumulator while still remaining less than or equal to the latter.

Also optionally, the division factor is chosen in such a way that the integer portion of the base two logarithm of the phase increment value of the first phase accumulator is equal to the integer portion of the base two logarithm of the phase increment value of the second phase accumulator.

Advantageously, a reduction in dynamics by quantization is provided between each phase accumulator and each respective digital-to-analog converter.

Also optionally, each reduction in dynamics is carried out by a Sigma-Delta modulation quantizer.

BRIEF DESCRIPTION OF THE DRAWINGS

The invention shall be better understood using the following description, provided solely as an example and made in reference to the annexed drawings wherein.

DESCRIPTION OF PREFERRED EMBODIMENTS

Figure 1:
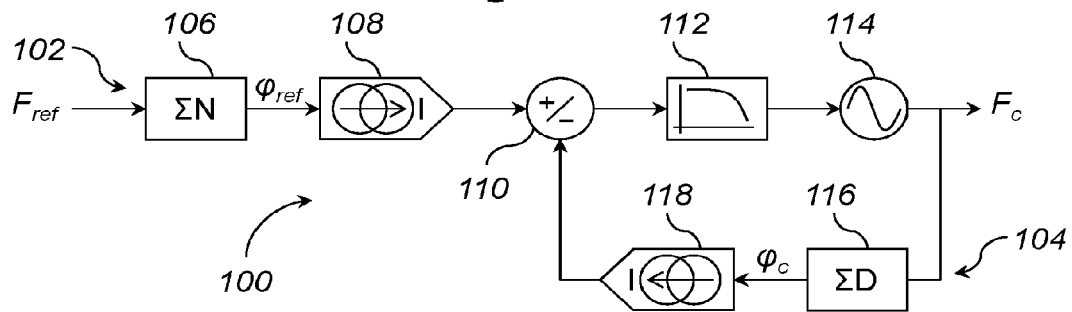
FIG. 1 diagrammatically shows the general structure of a feedback-loop frequency synthesis device, according to a first embodiment of the invention.

FIG. 1 diagrammatically shows a frequency synthesis device 100 of the PLL type, according to a first embodiment of the invention. This device 100 has an input intended to receive an electrical signal oscillating at a reference frequency $F_{ref}$ and an output intended to provide an electrical signal oscillating at an output frequency $F_c$.

It further comprises a servo circuit 102 for a control of the output frequency $F_c$ by the reference frequency $F_{ref}$ and a feedback loop 104 for the supply of information coming from the output electrical signal at the servo circuit 102.

More precisely, the servo circuit 102 connects the input to the output of the device 100 and comprises:
- a first phase accumulator 106 clocked at a frequency linked to the reference frequency $F_{ref}$: in the example of FIG. 1, the clocking is directly that of the frequency $F_{ref}$ and the phase accumulator 106 has an integer phase increment value noted as N,
- a first digital-to-analog converter 108 arranged as output of the first phase accumulator 106, formed by a current I generator, receiving an accumulated digital phase value $\phi_{ref}$ provided by the first phase accumulator 106,
- a phase comparator 110 of which a first comparison input is connected to the output of the first digital-to-analog converter 108,
- a loop filter 112 arranged as output of the phase comparator 110: in the example of FIG. 1, this is an analog filter, and
- a controlled frequency oscillator 114 arranged as output of the loop filter 112 and providing the electrical signal oscillating at the output frequency: in the example of FIG. 1, the oscillator 114 is of the VCO type, i.e. controlled by analog voltage supplied by the loop filter 112.

More precisely also, the feedback loop 104 recovers the electrical signal provided by the oscillator 114 in order to provide it as an input of a second phase accumulator 116 clocked at a frequency linked to the output frequency $F_c$: in the example of FIG. 1, the clocking is directly that of the frequency $F_c$ and the phase accumulator 116 has an integer phase increment value noted as D. The feedback loop 104 further comprises a second digital-to-analog converter 118 arranged as output of the second phase accumulator 116, formed by a current I generator of the same maximum amplitude as the first digital-to-analog converter 108, receiving an accumulated digital phase value $\phi_c$ provided by the second phase accumulator 116. The output of the second digital-to-analog converter 118 of the feedback loop 104 is connected to a second comparison input of the phase comparator 110.

A phase accumulator is, generally, a device clocked according to a predetermined clock frequency to increase, by a predetermined phase increment value, a digital value provided as output at each tick of the clock.

Figure 2:
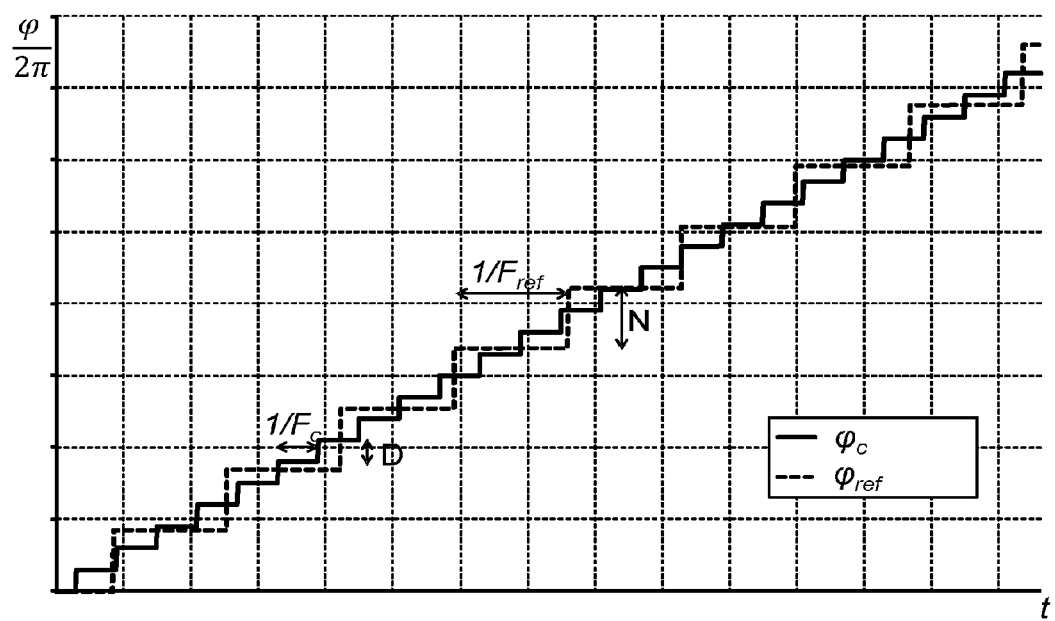
FIG. 2 is a chronogram showing the changes in digital data obtained using the device of FIG. 1, FIG. 3 diagrammatically shows the general structure of a feedback-loop frequency synthesis device, according to a second embodiment of the invention.

As such, as shown in FIG. 2 by the curve in interrupted lines for the first phase accumulator 106 (clocked by $F_{ref}$ and with a phase increment value N), the digital value of accumulated phase $\phi_{ref}$ is proportional to a theoretical straight time ramp of slope $2\pi \cdot N \cdot F_{ref}$. In reality, it is sampled at the frequency $F_{ref}$ and takes successive digital values N·i at successive instants $t_i$ where i is the index of the successive samples.

As such also, as shown in FIG. 2 by the curve with a continuous line for the second phase accumulator 116 (clocked by $F_c$ and with a phase increment value D), the digital value of accumulated phase $\phi_c$ is proportional to a theoretical straight time ramp of slope $2 \cdot D \cdot F_c$. In reality, it is sampled at the frequency $F_c$ and takes successive digital values D·j at successive instants $t_j$ where j is the index of the successive samples.

In theory, at each instant t:

$$[\phi_{ref} - \phi_c](t) = \pi \cdot t \cdot (N \cdot F_{ref} - D \cdot F_c).$$

Using the phase comparator 110, when the PLL is locked, the relation $F_c = \alpha \cdot F_{ref} = N/D \cdot F_{ref}$ is therefore indeed found theoretically.

But in practice, the instants $t_i$ and $t_j$ are not synchronized with each other and do not allow for a direct comparison of the samples of accumulated phases.

It is therefore advantageous and clever to:
- convert the digital value of the accumulated phase $\phi_{ref}$ into an analog signal in continuous time using the first digital-to-analog converter 108,
- convert the digital value of the accumulated phase $\phi_c$ into an analog signal in continuous time using the second digital-to-analog converter 118, and
- compare the two resulting analog signals in continuous time using the phase comparator 110, which can then have the simple form of an analog subtractor in continuous time, or an analog adder in continuous time if the sign of one of the two analog signals to be compared is beforehand inverted.

Indeed, by proceeding in this way by analog subtraction of accumulated phase values rather than by an attempt to resynchronize the samples of accumulated phases, or rather than by a direct comparison of phases of analog signals without calculating these phases beforehand, a comparison frequency is obtained that is entirely independent of that of the signals to be compared. It then becomes possible to consider designing a frequency synthesis device with a multiplication factor $\alpha = N/D$ with a high value for D, therefore a high resolution in frequency, without detrimental consequences on the time for establishing the operating regime and on the phase noise or other.

According to the embodiment of which the details were provided hereinabove, the digital values of the accumulated phases $\phi_{ref}$ and $\phi_c$ are respectively incremented by values N and D at each corresponding tick of the clock, i.e. at the instants $t_i$ for the digital value that represents the accumulated phase $\phi_{ref}$ and at instants $t_j$ for the digital value that represents the accumulated phase $\phi_c$. If nothing is provided, these digital values are intended to increase indefinitely, which then raises an issue of saturating the accumulators.

Figure 3:
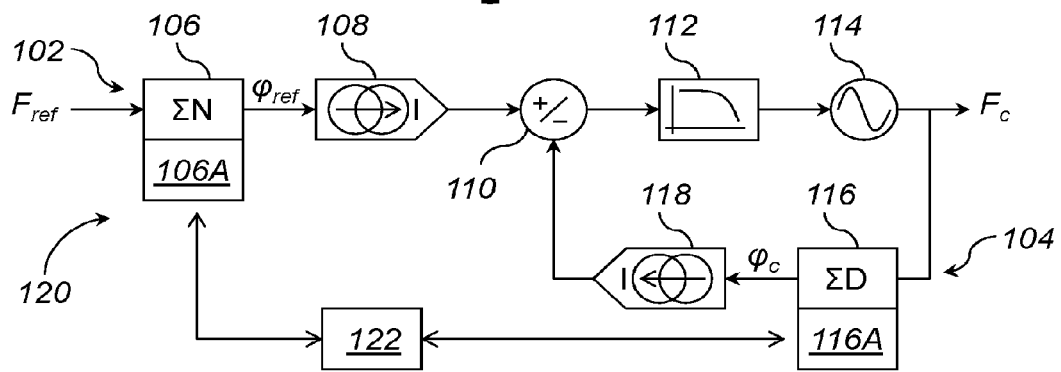

Simple solutions for resetting accumulators or for subtracting a modulo can be implemented when saturation or a predefined threshold is reached, but an improved embodiment, that resolves this problem of saturation in a clever manner, is proposed in reference to FIG. 3.

According to this second embodiment, a frequency synthesis device 120 of the PLL type comprises the same elements 102 to 118 as the device 100, organized in the same way, but with an additional synchronized correction mechanism 122. This mechanism 122 cooperates with or is integrated into adaptations 106A and 116A of the phase accumulators 106 and 116.

Functionally, the synchronized correction mechanism 122 is designed to detect any crossing, by one or the other of the phase accumulators 106 and 116, of a common threshold value $T_h$ beyond which it is provided to subtract a modulo value from the phase value accumulated in one or the other of the phase accumulators 106 and 116. This modulo value is for example equal to the threshold value $T_h$. More precisely, the synchronized correction mechanism 122 is provided to subtract the modulo value $T_h$ simultaneously in each one of the first and second phase accumulators 106, 116 as soon as the common threshold value $T_h$ is exceeded in each one of the first and second phase accumulators 106, 116. This subtraction is carried out at the same instant, which is for example either one of the instants $t_i$, or one of the instants $t_j$, according to the accumulator which is the second to reach the common threshold value $T_h$. It could also be an instant that is entirely independent of the clock signals. This synchronization is carried out in order to prevent any error with modulo in the subtraction calculation carried out by the phase comparator 110, given that the two phase accumulators 106 and 116 exceed very randomly and very rarely the common threshold value $T_h$ at the same instant. In accordance with this synchronization, the first phase accumulator 106 or 116 to reach the common threshold value $T_h$ is constrained to wait for the second phase accumulator 116 or 106 to also reach this threshold value while still continuing to increment its accumulation value beyond the common threshold value $T_h$.

Figure 4:
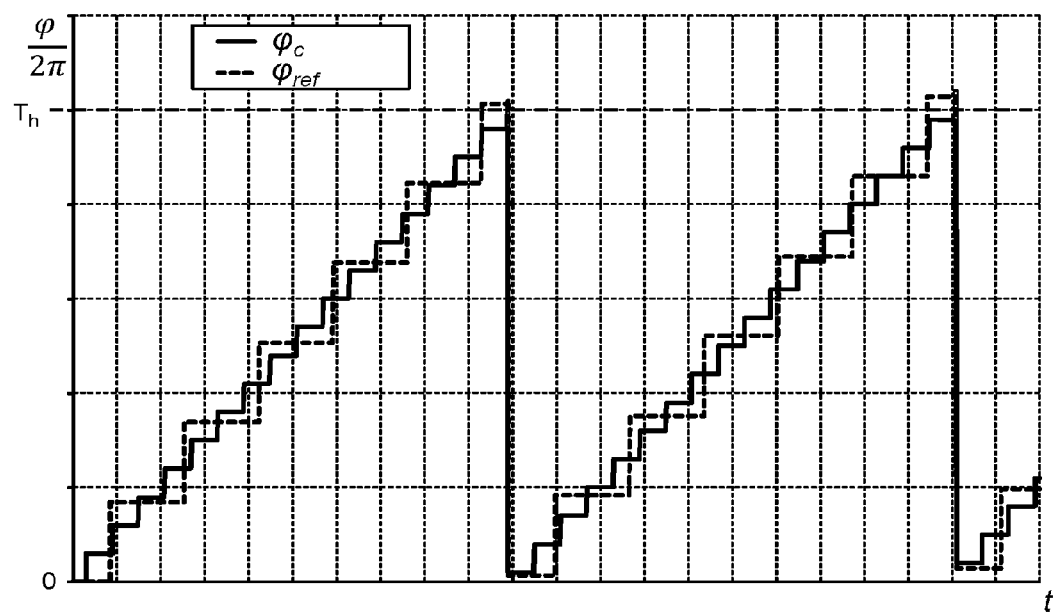
FIG. 4 is a time diagram showing the changes in digital data obtained using the device of FIG. 3, FIGS. 5 and 6 are frequency logarithmic scale spectra that show the characteristics of signals obtained using the device of FIG. 3, FIG. 7 diagrammatically shows the general structure of a feedback-loop frequency synthesis device, according to a third embodiment of the invention, FIG. 8 diagrammatically shows the general structure of a feedback-loop frequency synthesis device, according to a fourth embodiment of the invention.

As such, as shown in FIG. 4 by the curve in interrupted lines for the first phase accumulator 106 (clocked by $F_{ref}$ and with a phase increment value N), the digital value of accumulated phase $\phi_{ref}$ is proportional to a theoretical sawtooth time ramp of slope $2\pi \cdot N \cdot F_{ref}$. In reality, it is sampled at the frequency $F_{ref}$ and takes successive digital values incremented by N from one sample to the next from which are subtracted the value of modulo $T_h$ at each intervention of the synchronized correction mechanism 122.

As such also, as shown in FIG. 4 by the curve with a continuous line for the second phase accumulator 116 (clocked by $F_c$ and with a phase increment value D), the digital value of the accumulated phase $\phi_c$ is proportional to a theoretical sawtooth time ramp of slope $2\pi \cdot D \cdot F_c$. In reality, it is sampled at the frequency $F_c$ and takes successive digital values incremented by D from one sample to the next from which are subtracted the value of modulo $T_h$ at each intervention of the synchronized correction mechanism 122.

The two sawtooth curves of FIG. 4 are in this way synchronized in relation to one another independently of their respective clocks.

From a spectral standpoint, after the analog conversion in continuous time of the digital values coming from the two phase accumulators 106 and 116, carried out respectively by the two converters 108 and 118, the two analog signals in continuous time received by the phase comparator 110 have a frequency response that is very close to a straight line that starts from zero frequency and which decreases with the frequency.

In this respect, FIG. 5 shows, according to a frequency logarithmic scale, the frequency response of an analog signal in continuous time resulting from a phase ramp generated by a phase accumulator sampled by a clock signal of frequency $F_H$ equal to 1 MHz. The spectrum shown in this figure is as such made spurious by the frequency $F_H$ and its harmonics, a phenomenon that is well known to those skilled in the art. However the equivalent sampling taken by the phase accumulator does not generate spectrum aliasing or quantization noise as it is applied identically to each clock tick.

Furthermore, as the subtraction carried out by the phase comparator 110 is a linear operation in continuous time, the spectrum of the result of this operation is a subtraction of spectra of the two analog signals resulting from the digital values of accumulated phases $\phi_{ref}$ and $\phi_c$ without adding any additional noise.

FIG. 6 shows as such, according to a frequency logarithmic scale, the spectrum resulting as output of the phase comparator 110 for the experimental values of FIG. 4. When the PLL loop is stabilized, the straight lines of the responses in frequency tend to offset each other (here at −140 dB). Only the spurious peaks of the fundamental frequencies $F_{ref}$, $F_c$ and their harmonics emerge. When the multiplication factor α is greater than 1, the first spurious peak is found at the frequency $F_{ref}$, while in a conventional integer division and frequency divider frequency synthesis device, it would be found at the frequency $F_{ref}/D$. This here is a substantial improvement that makes it possible to either increase the cut-off frequency of the frequency synthesis device with a condition of stability by improving as much the time Δt for establishment of its operating regime, or to reduce much better the spurious signals and the phase noise without deteriorating this time Δt.

It also appears clearly that a frequency synthesis device 100 or 120 such as described hereinabove makes it possible to obtain a multiplication factor α=N/D with a high value for D and therefore a high resolution in frequency. Indeed, the phase accumulators 106 and 116 can easily be implemented with means for memorizing numbers in binary format, in particular for positive integer values such as N and D. They must therefore simply provide a sufficient number of bits in order to carry out the mathematical operations of accumulation of N and D and of comparing accumulated phase values with the threshold value $T_h$.

Given that the difference calculated next by the phase comparator 110 is a mathematical operation that only has meaning if the two phase accumulators 106 and 116 provide the same number of bits for N and D, it is therefore the highest number of bits between the binary representation of D and that of N which is retained. In addition as the accumulation is a sum, an additional retaining bit is at least required. Furthermore, when the threshold value $T_h$ is exceeded and when it is subtracted, as a modulo, from the value of an accumulator 106 or 116, it is preferable that the result also be either a positive integer or zero in order to retain the same presentation. For this purpose, $T_h$ must be chosen greater than or equal to the largest value between D and N. In conclusion, the minimum number of bits required as output of the phase comparator 110, and therefore also for the accumulators 106, 116 and the converters 108, 118 of the devices 100 and 120, can be defined by the following relation:

$$B=\text{FLOOR}[\log_2(\text{MAX}(N,D))]+2,$$

where FLOOR[ ] is the Floor function, FLOOR[ ]+1 then representing the Ceiling function, and where MAX( ) is the function that returns the maximum between two values.

In accordance with these calculations, the possibilities of the choice of values for D and for N for given values of a and $F_{ref}$ depend only on B. For B=32 for example, D can range up to $2^{31}-1$ (idem for N), where a conventional integer division frequency synthesis device has values for D limited to 100 or 1000. This is a substantial increase in the frequency resolution of the possible variations $F_{ref}/D$ of the multiplication factor α that a device can reach according to the invention as a function of B. The resolution of a fractional step frequency synthesis device can even be exceeded. For example, for a reference signal of 10 MHz and B=32, the frequency resolution is better than 0.005 Hz.

Reciprocally, for a given frequency resolution, since it is equal to $F_{ref}/D$, it is possible to increase $F_{ref}$ with D. This possibility is interesting for lowering the contribution of the reference signal in the phase noise as output in the bandwidth of the frequency synthesis device. Indeed in such a device, this contribution is directly due to the multiplication function of the reference frequency by the multiplication factor α. More precisely, in the bandwidth, the contribution of the phase noise of the reference signal is increased by 20·log(a) in decibels. It is therefore advantageous to decrease a and thus to increase $F_{ref}$ for a given $F_c$.

Figure 7:
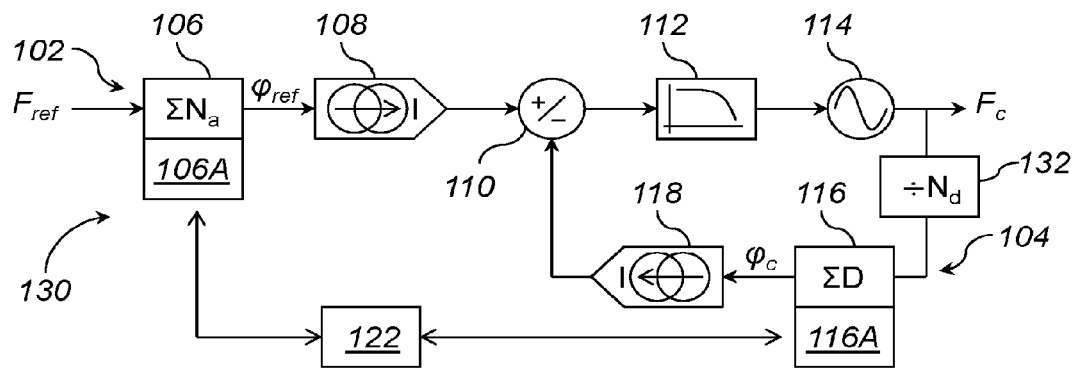

FIG. 7 diagrammatically shows a frequency synthesis device 130 of the PLL type, according to a third embodiment of the invention. This device 130 differs from the device 120 in that it comprises a frequency divider 132, arranged in the feedback loop 104 between the output and the second phase accumulator 116, and in that the phase increment value of the first phase accumulator 106 is adapted according to the value of the division factor of this frequency divider 132 for a desired servo factor of control of the output frequency $F_c$ by the reference frequency $F_{ref}$. More precisely, the value N is split into a product of two values $N_a$ and $N_d$, $N=N_a \cdot N_d$, with $N_a$ representing the phase increment value of the first phase accumulator 106 and $N_d$ the division factor of the frequency divider 132. As such the relation $F_c=\alpha \cdot F_{ref}=N/D \cdot F_{ref}=N_a \cdot N_d/D \cdot F_{ref}$ is retained. Note finally that the device 130 also differs from the device 120 in that the second phase accumulator 116 is no longer directly clocked at the output frequency $F_c$, but at the reduced frequency $F_c/N_d$ which remains however linked to $F_c$.

The advantage of this third embodiment in relation to the preceding one is to prevent an excessive difference between the phase increment values of the two phase accumulators 106 and 116 by splitting the value of N into two integer factors. Indeed, knowing that it is often desired to have a multiplication factor α that is largely greater than 1, the value of N is often largely greater than that of D, in such a way that, according to the calculation carried out hereinabove in reference to the two first embodiments of FIGS. 1 and 3, the minimum number B=FLOOR[log₂(MAX(N, D))]+2 is always dominated by the value of N and not by that of D. In this way, a certain number of implementation bits of the value D remain useless and this all the more so as factor α is greater. However, useless implementation bits mean as many logic gates that consume power uselessly.

In the third embodiment of FIG. 7, the calculation of B becomes:

$$B=\text{FLOOR}[\log_2(\text{MAX}(N_a,D))]+2.$$

Since $N_a$ is less than N, the number of useless implementation bits is reduced. Advantageously, the division factor $N_d$ can even be chosen in such a way that, for a desired servo factor of control of the output frequency by the reference frequency, $\alpha = N/D$, the phase increment value D of the second frequency accumulator 116 can be as close as possible to the phase increment value $N_a$ of the first phase accumulator 106 while still remaining less than or equal to the latter. In this case, few implementation bits are useless and the architecture is optimized in terms of power consumption. Clock frequencies $F_{ref}$ and $F_c/N_d$ of the two phase accumulators 106 and 116 also become close to one another, with that of the second phase accumulator 116 being slowed down in such a way as to further reduce consumption. This reduction is furthermore not offset by the adding of the frequency divider 132. The optimum is reached for FLOOR $[\log_2(N_a)] = \text{FLOOR}[\log_2(D)] = B-2$. It is however not interesting that the value $N_a$ is less than D, because in this case the first spurious frequency in the output spectrum would no longer be $F_{ref}$ but $F_c/N_d$. It would further result from this, either a degradation in the time $\Delta t$ for establishing the operating regime, or a degradation in the reducing of the spurious frequencies, according to the cut-off frequency chosen for the loop filter 112.

The compensation for this improvement in consumption is a loss in the frequency resolution which becomes $F_{ref}N_d/D$ and no longer $F_{ref}/D$. It is therefore degraded by a factor $N_d$.

Figure 8:
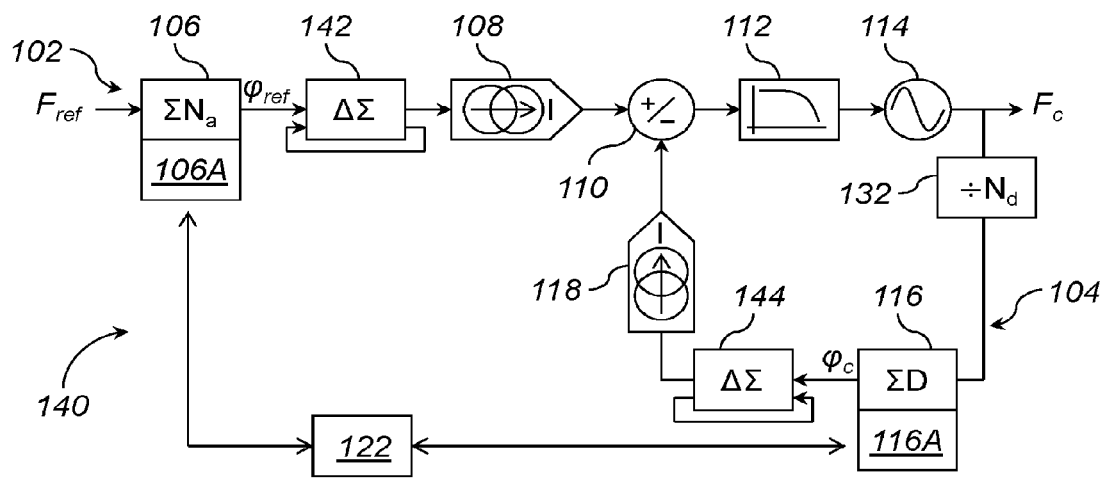

FIG. 8 diagrammatically shows a frequency synthesis device 140 of the PLL type, according to a fourth embodiment of the invention. This device 140 differs from the device 130 in that each digital-to-analog converter 108 or 118 is preceded with a device for reducing the dynamics by quantization. More precisely, this reduction in dynamics is for example carried out using a Sigma-Delta modulation quantizer. As such, a first Sigma-Delta modulation quantizer 142 is arranged between the first phase accumulator 106 and the first digital-to-analog converter 108. Likewise, a second Sigma-Delta modulation quantizer 144 is arranged between the second phase accumulator 116 and the second digital-to-analog converter 118.

This embodiment has the advantage of facilitating the implementation of the two converters 108 and 118. Indeed, without reduction of dynamics by quantization, for accumulated phase values coded on B bits at the output of phase accumulators, with the full scale of the converters being a constant value I, the value that corresponds to the least significant bit is:

$$I_{lsb} = \frac{I}{2^B - 1}.$$

This value can become very small when B increases, i.e. when the frequency resolution is high. For example, for I=100 µA and B=32, $I_{lsb}$~23 fA.

As such, the reduction in dynamics allows for a reduction in the number of bits taken into consideration in the converters, rendering them simpler to carry out.

Generally, in order to reduce the number of bits provided as input of the converters, the simplest solution consists of truncating the values to be converted over a number of bits B' less than B by suppressing the least significant bits. This truncation is mathematically equivalent to a new quantization of the digital data. This quantization produces an error which is in general assimilated as a noise, referred to as quantization noise. This noise has a rather random spectrum but which is often approached by a flat spectrum of white noise. The analog/digital converters then only need to convert B' bits at the price of spurious noise that can be assimilated to additional noise in the output spectrum of the frequency synthesis device. Due to the frequency servo, this noise is located primarily around the cut-off frequency of the device, its standard deviation decreasing when B' increases.

The interest in using a Sigma-Delta modulation quantizer in order to carry out the reduction in dynamics is to reduce this quantization noise, due to the fact that the phase comparator 110 is followed by a bypass filter, here the loop filter 112. Indeed, the Delta-Sigma modulation function deforms the spectrum of the quantization noise by generating less low-frequency noise and more high-frequency noise close to $F_{ref}$ and $F_c/N_d$. This noise is then filtered better by the loop filter 112 if the frequencies $F_{ref}$ and $F_c/N_d$ are high enough as compared to the cut-off frequency of the device. Note that in practice the order of the filter must be strictly greater than that of the Delta-Sigma modulation. In this fourth embodiment, the loop filter 112 is therefore at a minimum of order 2, knowing that in addition it cannot be of an excessively high order, i.e. it remains advantageously of an order less than or equal to 3.

By way of a non-limiting example, a Sigma-Delta modulation quantizer of order 1 is very simple to implement because it is always stable. It can be constituted of an adder followed by a register of B bits+1 retaining bit, of which the output is truncated by taking the B' most significant bits while the remaining (B+1−B') least significant bits are completed with 0 as more significant bits in order to obtain a new value over B bits as input. The value of the new data created as such represents the fraction that was truncated as output of the register. This value is added to the current input data over B bits and the result recorded in the register for the next cycle. In this way the Sigma-Delta modulation quantizer never erases the quantization error, by postponing it over time.

Figure 9:
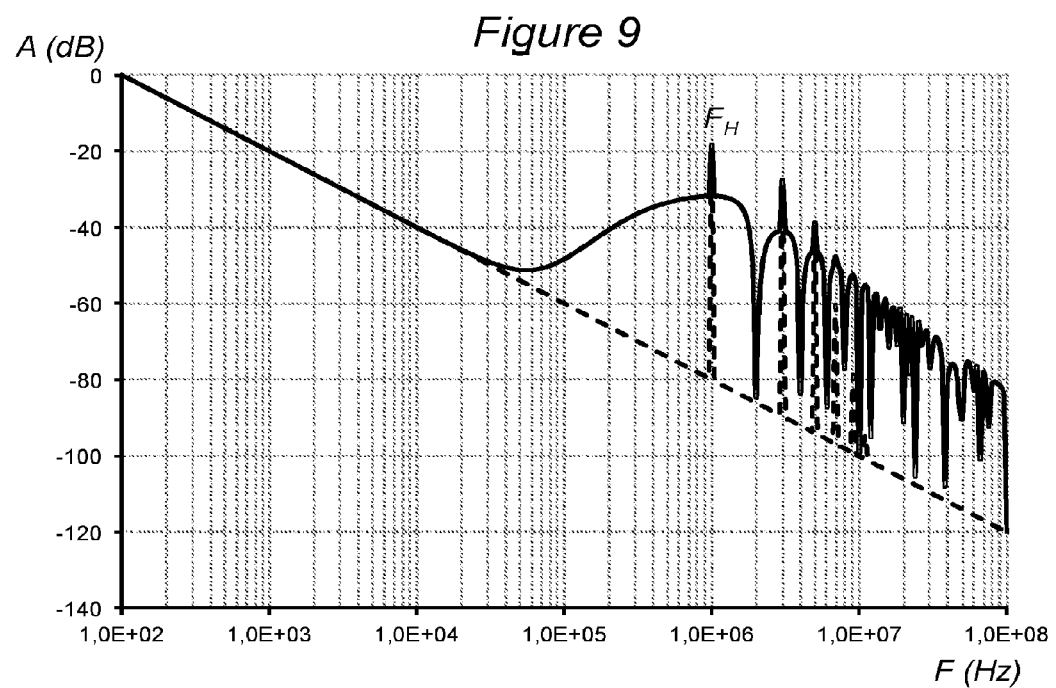
FIG. 9 is a frequency logarithmic scale spectrum that shows the characteristics of a signal obtained using the device of FIG. 8, FIGS. 10 and 11 show two examples of loop filters for any of the frequency synthesis devices of FIGS. 1, 3, 7 and 8, FIG. 12 diagrammatically shows the general architecture of a synchronized correction mechanism of any one of the frequency synthesis devices of FIGS. 3, 7 and 8.

FIG. 9 shows, according to a frequency logarithmic scale, the frequency response of an analog signal in continuous time resulting:

from a phase ramp generated by a phase accumulator subjected to a clock signal of frequency $F_H$ equal to 1 MHz, and from a reduction in dynamics by quantization carried out at the output of the accumulator using a Sigma-Delta modulation quantizer.

In addition to the interference by the frequency $F_H$ and its harmonics, the spectrum shown in this figure shows a quantization noise reported primarily around these spurious frequencies, without any substantial change in the low frequencies if it is compared with the spectrum of FIG. 5. This noise is intended to be filtered by the loop filter 112, and this all the more so that $F_{ref}$ is high in relation to the cut-off frequency of the device. Given that a frequency synthesis device according to the invention makes it possible to increase the reference frequency easily with a constant multiplication factor $\alpha$, it distinguishes, also from the standpoint of the use of a Delta-Sigma modulation, from a fractional step frequency synthesis device wherein this reference frequency is more difficult to increase.

It clearly appears that a frequency synthesis device such as one of those described hereinabove comprises at least part of the following advantages, with the fourth embodiment of which the details are provided hereinabove combining them all:

a high frequency resolution of the adjusting of the output signal can be reached and is practically not tributary to the reference frequency, contrary to frequency synthesis devices with a fractional step, this high frequency resolution is not obtained to the detriment of a phase noise injected into the output signal, it behaves as a conventional integer division frequency synthesis device with a very close transfer function, in such a way that the study of it is simplified, the frequency $F_{ref}$ of the reference signal can be as high as desired, with its contribution to the total phase noise as output, $20 \cdot \log(\alpha)$, being decreased by as much for a given output frequency $F_c$, the spurious signals present in the output spectrum are shifted to the high frequencies, in such a way that they are filtered better by the loop filter, its cut-off frequency can be increased within the limits of stability, in such a way that the time for establishing its operating regime can be reduced, and the frequency resolution does not depend on the number of bits taken into account in the digital/analog converters used.

In terms of industrial application, any one of the devices described hereinabove can be integrated into any device that requires frequency synthesis, such as for example a radio-frequency receiver or transmitter, a sequencing clock of digital, analog or mixed circuits (i.e. analog and digital), a clocked measuring system, a time base, etc.

Concrete examples of electronic architectures shall now be given for each one of the functional elements that constitute the frequency synthesis devices described hereinabove.

Figure 10:
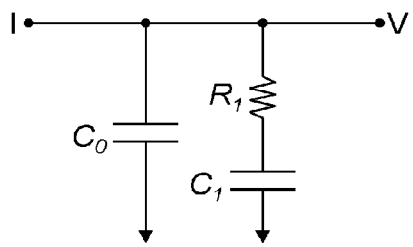

FIG. 10 shows an example of a filter of order 1 that can be chosen in order to carry out the loop filter 112 of any one of the frequency synthesis devices of FIGS. 1, 3 and 7. This filter of order 1 receives as input an analog current I from the phase comparator 110 and provides as output an analog control voltage V to the oscillator 114. It further comprises a first capacitive circuit $C_0$ that connects the input to the ground in order to carry out an integration function by inserting a pole at zero frequency. It further comprises a second resistive and capacitive circuit $R_1$, $C_1$ connecting the output to the mass in order to create a phase margin by inserting a low-frequency zero. This filter of order 1 cannot be used in the frequency synthesis device of FIG. 8 since it cannot be of an order strictly greater than that of the Delta-Sigma quantizers 142 and 144.

Figure 11:
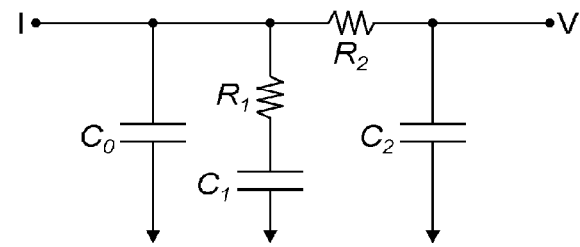

FIG. 11 shows an example of a filter of order 2 that can be chosen in order to carry out the loop filter 112 of any one of the frequency synthesis devices of FIGS. 1, 3, 7 and 8. This filter of order 2 differs from the filter of FIG. 10 in that a third resistive circuit $R_2$ is inserted between the second circuit $R_1$, $C_1$ and the output, and in that a fourth capacitive circuit $C_2$ connects the output to the ground. These two additional circuits add a pole beyond the cut-off frequency of the filter.

Figure 12:
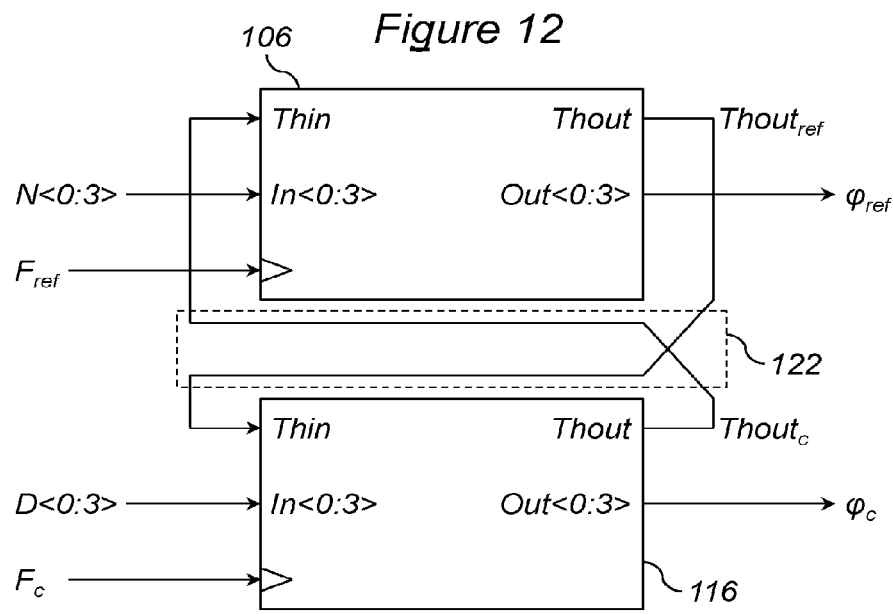

FIG. 12 diagrammatically shows the general architecture of a synchronized correction mechanism 122 cooperating with the two phase accumulators 106, 116 of any of the frequency synthesis devices of FIGS. 3, 7 and 8.

Each phase accumulator 106 or 116 is clocked according to a predetermined frequency, $F_{ref}$ for the accumulator 106 and $F_c$ for the accumulator 116, and stores a phase increment value that it may receive, N (or $N_a$) for the accumulator 106 and D for the accumulator 116, in an input register In. An output register Out is incremented by the phase increment value at each clock tick for the supplying as output of a digital value of accumulated phase, $\phi_{ref}$ for the accumulator 106 and $\phi_c$ for the accumulator 116.

Furthermore, each phase accumulator 106 or 116 is adapted, according to an example of adaptation 106A for the accumulator 106 and according to an example of adaptation 116A for the accumulator 116, in order to receive on an input Thin, independently of its clock ticks, a binary signal for exceeding the threshold value $T_h$ by the other accumulator and in order to provide on an output Thout a binary signal for exceeding the threshold value $T_h$ by itself. The binary signal for exceeding the threshold of the output Thout passes and remains at 1 when the threshold value $T_h$ has been reached or exceeded by the corresponding accumulator. It is 0 otherwise.

In this context, the synchronized correction mechanism 122 comprises:

a connection for the transfer of the current value of the binary signal Thout$_{ref}$ for exceeding the threshold value $T_h$ by the accumulator 106 to the input Thin of the accumulator 116, and a connection for the transfer of the current value of the binary signal Thout$_c$ for exceeding the threshold value $T_h$ by the accumulator 116 to the input Thin of the accumulator 106.

In each phase accumulator 106, 116, the modulo value is subtracted from the value stored in the output register Out as soon as the input Thin and the output Thout are at 1.

In the precise and non-limiting example of FIG. 12, the phase increment values N (or $N_a$) and D are coded on 4 bits and the registers In, Out occupy 4 bits of memory. The threshold value $T_h$, which is equal to the modulo value, is 8.

Figure 13:
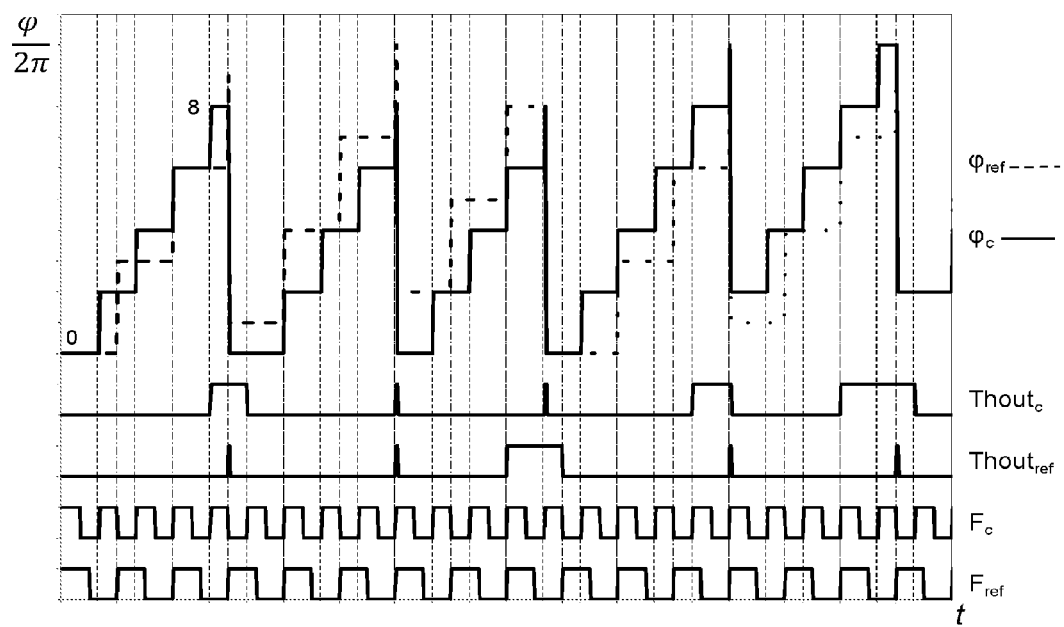
FIG. 13 is un chronogram showing the changes in digital data obtained using the mechanism of FIG. 10, FIG. 14 diagrammatically shows the architecture of an example of a phase accumulator adapted for the frequency synthesis device of FIG. 3 or 7, FIG. 15 diagrammatically shows the architecture of an example of a phase accumulator with a reduction in dynamics via Delta-Sigma modulation adapted for the frequency synthesis device of FIG. 8, and FIG. 16 diagrammatically shows the architecture of an example of digital-to-analog converter adapted to be arranged at the output of the phase accumulator of FIG. 15 in the frequency synthesis device of FIG. 8.

FIG. 13 shows an example of a chronogram obtained in accordance with this example, with N=3 and D=2, for clock frequencies $F_{ref}$, $F_c$ and digital values Thout$_{ref}$, Thout$_c$, $\phi_{ref}$ and $\phi_c$. It is clearly visible that the phase accumulator that passes the threshold value $T_h$ first generates a positive pulse on the output Thout that is much longer than for the other phase accumulator as it is on hold. It can also be noted that the failing edges of the binary signals for exceeding the threshold value always take place on rising edges of their respective clocks.

Figure 14:
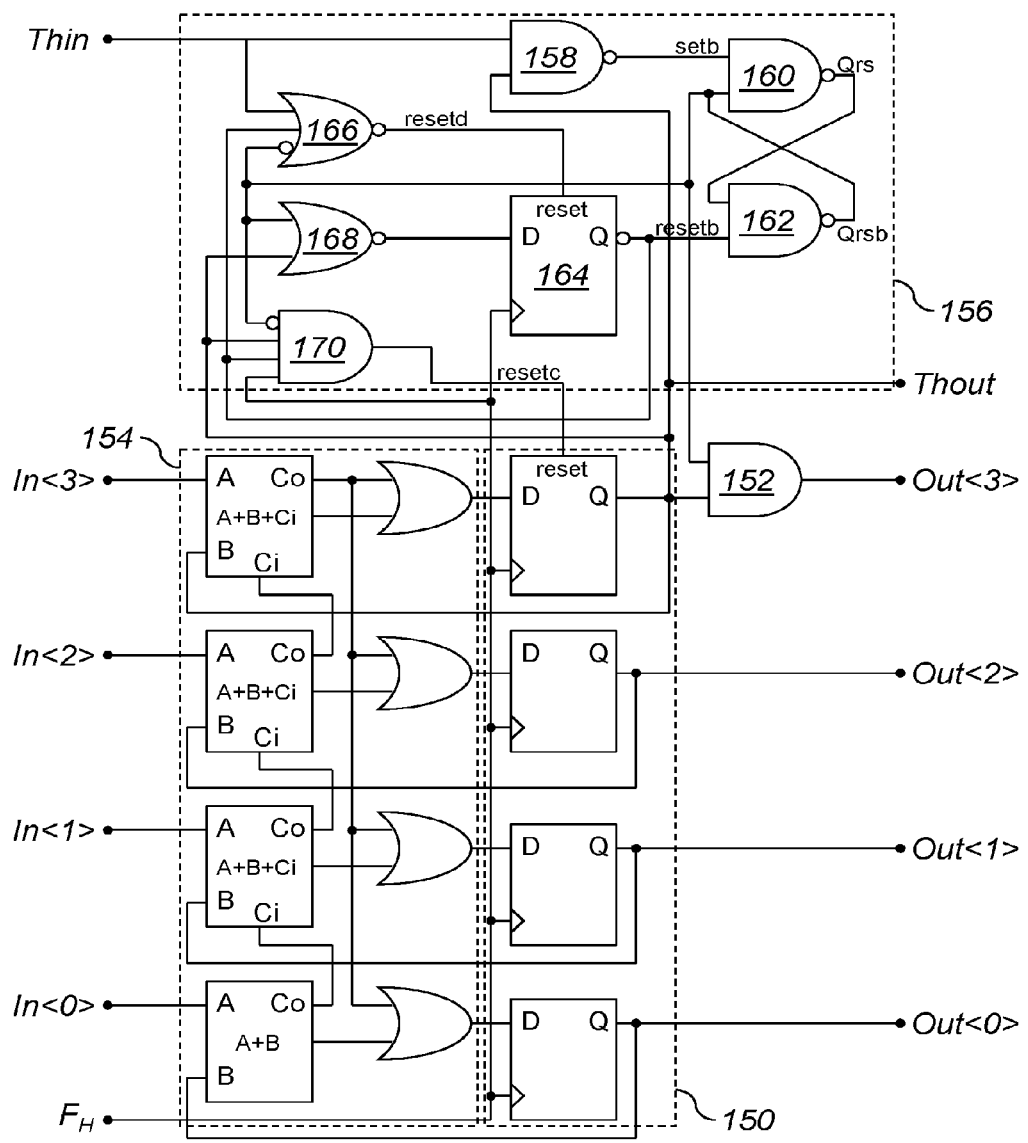

FIG. 14 diagrammatically shows the general architecture, in terms of registers and logic gates, of an example of a phase accumulator 106 or 116 adapted for the frequency synthesis device of FIG. 3 or 7. This example is in particular adapted to the specific case shown in FIG. 12 according to which the phase increment values N (or $N_a$) and D are coded on 4 bits and the registers In, Out occupy 4 bits of memory.

This architecture comprises a memory register 150 with four synchronous flip-flops clocked by the clock frequency $F_H$ ($F_{ref}$ for the phase accumulator 106 and $F_c$ for the phase accumulator 116). The four binary outputs of this register 150 supply the four bits Out<0>, Out<1>, Out<2>, Out<3> of the output register Out, by the intermediary of a logic AND gate 152 with regards to the more significant bit Out<3>. The four binary inputs of this register 150 are supplied by a 4-bit adder 154 with four binary addition modules connected together conventionally in order to carry out an addition over 4 bits. The four bits In<0>, In<1>, In<2>, In<3> of the input register In supply four respective inputs of the binary addition modules of the adder 154, which also receive the four binary outputs of the memory register 150 in order to carry out the operation of accumulation. The outputs of the four binary addition modules are provided to four respective logic OR gates of the adder 154 also all supplied by the retaining "Co" of the binary addition module relating to the more significant bit In<3>. This taking into account of the last retaining using logic OR gates is established in order to saturate the result of the adder 154 over each one of the bits in order to prevent any untimely reset during the time of establishing the operating regime of the frequency synthesis device.

The architecture of FIG. 14 further comprises a circuit 156 for detecting the exceeding of the threshold value $T_h$ and for applying the modulo value. These two values are, in this example, equal to 8, which corresponds to the most significant bit of the memory register at 1 for a particularly simple implementation. The detecting of the exceeding of the threshold value $T_h$ therefore consists in detecting the passage to 1 of this most significant bit which is for this connected to the output Thout, which instantly transmits its value to the input Thin of the other phase accumulator. The subtraction of the modulo value consists in resetting this bit to zero, which can be carried out asynchronously by a "resetc" signal provided by the circuit 156, with this signal being applied asynchronously to the most significant synchronous flip-flop of the memory register 150. The subtraction of the modulo value can also be carried out by forcing to zero the bit Out<3> of the output register Out using the logic AND gate 152 which not only receives the value of the most significant bit of the memory register 150 (i.e. the value of the output Thout), but also a "Qrsb" signal provided by the circuit 156.

The circuit 156 receives the value of the input Thin on a logic AND gate 158 which also receives the value of Thout and of which the output is inverted in order to provide a "setb" signal as input of a logic NAND gate 160 of a flip-flop RS of which the other logic NAND gate 162 provides the "Qrsb" signal. This "Qrsb" signal is also provided as input of the logic NAND gate 160 which in turn provides a "Qrs" signal as input of the logic NAND gate 162. This logic NAND gate 162 also receives a "resetb" signal provided by the inverted output of a synchronous flip-flop 164 clocked by the clock frequency $F_H$.

The circuit 156 further comprises a logic NOR gate 166 with three inputs of which one is inverting: the value of the input Thin and the "resetb" signal are provided as non-inverting inputs of the logic NOR gate 166, while the inverting input receives the "Qrsb" signal.

The circuit 156 further comprises a logic NOR gate 168 that receives the "Qrsb" signal and the value of the output Thout. Its inverted output is connected to the input of the synchronous flip-flop 164.

Finally, the circuit 156 comprises an AND gate 170 with four inputs of which one is inverting: one of the non-inverting inputs is clocked by the clock frequency $F_H$, the two others receive the "resetb" signal and the value of the output Thout, while the inverting input receives the "Qrsb" signal. This AND gate 170 provides the "resetc" signal.

The circuit 156 operates in the following manner. In order for the "resetc" signal to reset the most significant bit of the memory register 150, the values of the input Thin and of the output Thout must both pass to 1 and that must set to 0, by the "setb" signal, the "Qrsb" signal provided by the flip-flop RS 160, 162. Once the "Qrsb" signal is at 0, it is the AND gate 170 that carries out the resetting but with the condition that the clock signal is also at 1 in order to avoid being too close to the set up time of the synchronous flip-flop that manages the most significant bit of the memory register 150, with the latter being active on the rising edges of the clock signal. Through its passing to 0, the "Qrsb" signal precisely indicates the instant when the two phase accumulators 106 and 116 have passed the threshold value $T_h$.

However, thanks to the synchronous flip-flop 164 and its "resetb" signal, the flip-flop RS 160, 162 is not reinitialized at the same time over the two phase accumulators in order to take into account the reset and hold time of the synchronous flip-flops in relation to their respective clockings. More precisely, the flip-flop RS 160, 162 is set to 0 by the "resetb" signal at the time of the rising edge of the signal of the clock frequency $F_H$. Thanks to the logic NOR gate 168, this takes place when the value of the output Thout is effectively 0 and as long as the "Qrsb" signal is 0. Furthermore, the synchronous flip-flop 164 can itself be reset by the "resetd" signal. This makes it possible to prevent the setting to 0 of the flip-flop RS 160, 162 as long as the value of the input Thin has not changed to 1 through the logic NOR gate 166. It is this mechanism that validates the synchronization of the two phase accumulators.

Figure 15:
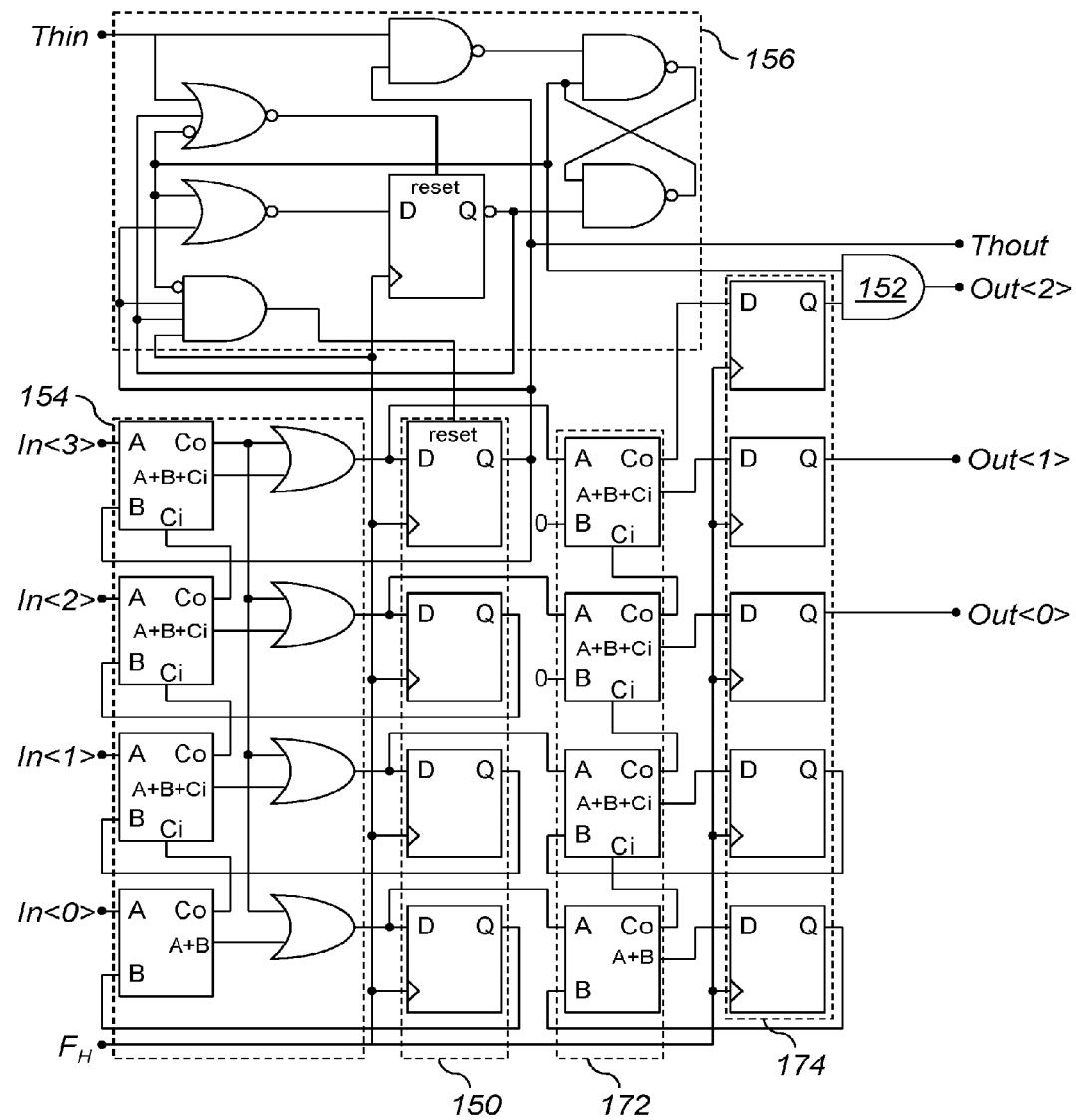

FIG. 15 diagrammatically shows the general architecture, in terms of registers and logic gates, of an example of a phase accumulator 106 or 116 combined with a Delta-Sigma quantizer 142 or 144, adapted for the frequency synthesis device of FIG. 8. This example is in particular adapted to the specific case shown in FIG. 12 according to which the phase increment values N (or $N_a$) and D are coded on 4 bits and the registers In, Out occupy 4 bits of memory.

In accordance with this example, the phase accumulation function is carried out by the memory register 150, the 4-bit adder 154 and the circuit 156, arranged as hereinabove in the example of FIG. 14. The dynamics reduction function using a Sigma-Delta modulation quantizer is carried out by an additional 4-bit adder 172 and by an additional memory register 174, with these two modules being inserted between the memory register 150 and the logic AND gate 152.

More precisely, the additional adder 172 comprises four binary addition modules connected together conventionally in order to carry out an addition over 4 bits. The four output bits of the adder 154 supply four respective inputs of the binary addition modules of the additional adder 172, which also receive either 0s, or outputs of the additional memory register 174 according to the desired dynamics reduction.

For example, in order to obtain an output register Out over 3 bits Out<0>, Out<1>, Out<2>, the additional memory register 174 comprises five synchronous flip-flops clocked by the clock frequency $F_H$, among which:

the first two synchronous flip-flops relating to the two least significant bits receive the respective outputs of the two binary addition modules of these two bits in order to provide them again with these values as input at the next clock tick, the next two synchronous flip-flops relating to the two most significant bits receive the respective outputs of the two binary addition modules of these two bits in order to provide as output values intended for the register Out, the fifth and last synchronous flip-flop receives the retaining Co of the binary addition module relating to the most significant bit in order to provide as output a value intended for the register Out.

The two binary addition modules relating to the two most significant bits receive 0s.

The bit Out<2> is determined by the output of the logic AND gate 152 of which an input is always supplied by the "Qrsb" signal but of which the other input is supplied by the output of the last synchronous flip-flop of the additional memory register 172.

The bit Out<1> is determined by the output of the fourth synchronous flip-flop of the additional memory register 174.

Finally, the bit Out<0> is determined by the output of the third synchronous flip-flop of the additional memory register 174.

A quantizer over 3 bits with Delta-Sigma modulation of order 1 that is always stable is as such obtained. The two most significant bits that were truncated represent the rounded output and are replaced with zeros on the corresponding inputs of the additional adder 172. For these bits, the addition as such consists only in adding and in propagating the retaining of the less significant bit. In this way the result is the sum of the current accumulated phase value over 4 bits and of the fraction over 2 bits subtracted from the previous result delayed by one clock period. This is indeed the integral sum of the quantization error, which is the principle of a Delta-Sigma modulation. When such an architecture is used to implement the Sigma-Delta modulation quantizers 142 and 144, it is advantageous to use the architecture of FIG. 11 to implement the loop filter 112.

Figure 16:
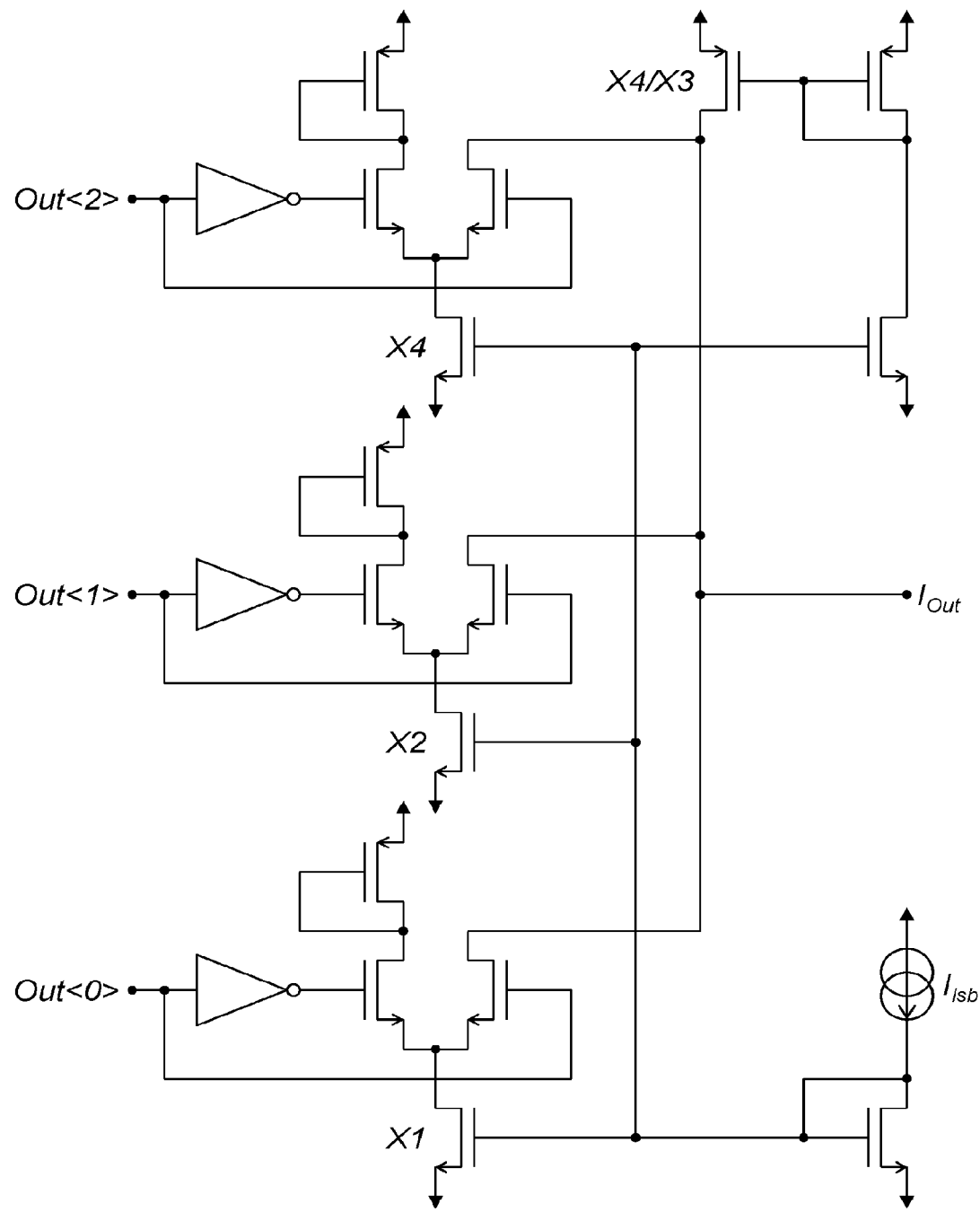

FIG. 16 diagrammatically shows the general architecture of an example of an analog/digital converter 108 or 118, adapted to be arranged at the output of the accumulator/quantizer unit 106/142 or 116/144 of FIG. 15 in the frequency synthesis device of FIG. 8. Many converters can be suitable but this figure shows a steering current DAC.

This analog/digital converter receives as input the data of the register Out over the 3 bits Out<0>, Out<1>, Out<2> but could be simply adapted to be extended to a larger number of bits. It has the advantage of directly providing a signed current $I_{Out}$ at its output.

It is based on current mirrors with a multiplication factor of a power of 2, with these mirrors being carried out using a reference current $I_{lsb}$. The least significant bit Out<0> of the input binary data uses a mirror X1, the next significant bit Out<1> a mirror X2 and the most significant bit Out<2> a mirror X4. The current is steered by a differential pair of NMOS transistors controlled by an input bit and its complement. When this bit is at 1 the corresponding current is summed on the output $I_{out}$. Otherwise it is applied to a PMOS transistor mounted as resistance towards the power supply. The latter makes it possible to maintain the polarization of the mirror. Through this method of current summation, the current dynamics on $I_{Out}$ ranges from 0 to $7 \cdot I_{sub}$. Another current mirror formed from complementary PMOS transistors makes it possible to sum over $I_{out}$ an inverse current of $4 \cdot I_{sub}$ or $3 \cdot I_{sub}$. The transfer function of the converter therefore becomes: $I_{Out}$ t=(4-Out)·$I_{sub}$ or $I_{Out}$=(3-Out)·$I_{sub}$ in the direction of the outgoing current. $I_{sub}$ is chosen such that: $I_{sub}=I/(2^3-1)=I/7$.

Note that the analog/digital converter 108 or 118 is not, a priori, clocked by a clock frequency. In particular, its components relating to any bit concerned by the threshold value $T_h$ are advantageously not subjected to the clock frequency. On the other hand, its other components can be.

With regards to the architecture of the phase comparator 110, in the case where the two digital/analog converters 108 and 118 are such as the example shown in FIG. 16, it is for example reduced to its simplest expression by connecting their outputs $I_{Out}$ but by taking care to invert bit-by-bit the binary value provided as input of the converter 118. In this way, the value applied to the converter 118 is $7-\phi_{ref}$ which makes it possible to obtain the opposite current as output. When the currents of the two digital/analog converters 108 and 118 are added together as output, $I_f=I_{lsb} \cdot (1+\phi_{ref}-\phi_c)$ is obtained which is the current that will be applied to the loop filter 112. The remaining current offset $I_{lsb}$ can possibly be suppressed by passing from X4 to X3 the factor of the PMOS current mirror of one of the two converters. We then have $I_f=I_{lsb} \cdot (\phi_{ref}-\phi_c)$.

With regards to the general architectures of the controlled frequency oscillator 114 and of the frequency divider 132, they are well known and detailed will not be provided. The oscillator 114 is for example a voltage-controlled oscillator formed from a self-inductance placed in parallel with two varactors arranged head-to-tail and from two NMOS transistors of which the gates are mounted head-to-tail in such a way as to generate a gain that is sufficient to trigger then maintain the oscillation at the self-inductance terminals, with these transistors being polarized thanks to the current coming from the power supply of the middle point of the self-inductance.

Note furthermore that the invention is not limited to the embodiments described hereinabove. It will indeed appear to those skilled in the art that various modifications can be made to the embodiments described hereinabove, in light of the teaching that has just been disclosed to them. In the claims that follow, the terms used must not be interpreted as limiting the claims to the embodiments exposed in this description, but must be interpreted to include therein all of the equivalents that the claims aim to cover due to their formulation and of which the foresight is within the scope of those skilled in the art by applying their general knowledge to the implementation of the information that has just been disclosed.

The invention claimed is:

1. A feedback-loop frequency synthesis device comprising:
   an input intended to receive an electrical signal oscillating at a reference frequency,
   an output intended to provide an electrical signal oscillating at an output frequency,
   a servo circuit for the control of the output frequency by the reference frequency, connecting the input to the output of the device and comprising a first phase accumulator clocked at a frequency linked to the reference frequency, an analog phase comparator, a first digital-to-analog converter arranged between the first phase accumulator and the analog phase comparator, a loop filter and a controlled frequency oscillator providing the electrical signal oscillating at the output frequency, and
   a feedback loop connecting the output to one of two comparison inputs of the analog phase comparator, comprising a second phase accumulator clocked at a frequency linked to the output frequency and a second digital-to-analog converter arranged between the second phase accumulator and the analog phase comparator,
   wherein a reduction in dynamics by quantization is provided between each phase accumulator and each respective digital-to-analog converter, with this quantization being carried out by truncation of digital values of accumulated phases, coded on B bits at the output of each phase accumulator, over a number of bits B' less than B.

2. The frequency synthesis device according to claim 1, wherein each truncation is carried out by suppression of the B-B' less significant bits of the digital values of accumulated phases.

3. The frequency synthesis device according to claim 1, wherein each dynamics reduction is carried out by a Sigma-Delta modulation quantizer.

4. The frequency synthesis device according to claim 1, wherein the analog phase comparator is an adder or subtractor in continuous time of the analog signals that it receives as input.

5. The frequency synthesis device according to claim 1, wherein the first and second phase accumulators have a common accumulated phase threshold value beyond which it is provided to subtract a modulo value from the phase value accumulated in each one of the first and second phase accumulators.

6. The frequency synthesis device according to claim 5, wherein a synchronization mechanism is provided in order to subtract the modulo value at the same instant in each one of the first and second phase accumulators as soon as the common threshold value is exceeded in each one of the first and second phase accumulators.

7. The frequency synthesis device according to claim 5, wherein the threshold value and the modulo value are equal.

8. The frequency synthesis device according to claim 1, wherein a frequency divider is arranged in the feedback loop between the output and the second phase accumulator.

9. The frequency synthesis device according to claim 8, wherein the frequency divider has a division factor chosen in such a way that, for a desired servo factor of control of the output frequency by the reference frequency, the second phase accumulator has a phase increment value that can be as close as possible to a phase increment value of the first phase accumulator while still remaining less than or equal to the latter.

10. The frequency synthesis device according to claim 9, wherein the division factor is chosen in such a way that the integer portion of the base two logarithm of the phase increment value of the first phase accumulator is equal to the integer portion of the base two logarithm of the phase increment value of the second phase accumulator.

\* \* \* \* \*